United States Patent [19]

Degawa et al.

[11] Patent Number: 5,011,790
[45] Date of Patent: Apr. 30, 1991

[54] METHOD OF MANUFACTURING CUBIC BORON NITRIDE P-N JUNCTION BODY

[75] Inventors: Junji Degawa; Kazuwo Tsuji, both of Hyogo, Japan

[73] Assignee: Sumitomo Electric Industries, Ltd., Osaka, Japan

[21] Appl. No.: 317,946

[22] Filed: Mar. 2, 1989

[30] Foreign Application Priority Data

Mar. 3, 1988 [JP] Japan .................. 63-51009

[51] Int. Cl.$^5$ .................. H01L 21/22; C30B 29/38
[52] U.S. Cl. .................. 437/134; 501/86; 501/96; 423/890; 423/446; 156/603; 437/137
[58] Field of Search .................. 423/290, 446; 501/86, 501/96; 156/603; 437/116, 137, 134

[56] References Cited

U.S. PATENT DOCUMENTS

| | | | |
|---|---|---|---|
| 2,941,248 | 6/1960 | Hall | 437/137 |
| 3,078,232 | 2/1963 | Wentorf, Jr. | |
| 3,141,802 | 7/1964 | Wentorf, Jr. | |
| 3,216,942 | 11/1965 | Wentorf, Jr. | |
| 3,423,177 | 1/1969 | Bovenkerk | 423/446 |
| 3,959,443 | 5/1976 | Kabayama | 423/290 |
| 4,034,066 | 7/1977 | Strong et al. | 423/446 |
| 4,089,933 | 5/1978 | Vereschagin et al. | 423/446 |
| 4,220,455 | 9/1980 | St. Pierre et al. | 51/295 |
| 4,247,304 | 1/1981 | Morelock | 51/295 |
| 4,287,168 | 9/1981 | Wentorf, Jr. et al. | 423/446 |
| 4,301,134 | 11/1981 | Strong | 423/446 |
| 4,377,565 | 3/1983 | Setaka | 423/446 |
| 4,409,193 | 10/1983 | Sato et al. | 423/290 |
| 4,430,051 | 2/1984 | von Platen | 423/446 |
| 4,536,442 | 8/1985 | Bovenkok et al. | 423/446 |
| 4,544,540 | 10/1985 | Tsuji | 423/446 |
| 4,547,257 | 10/1985 | Iizuka et al. | 423/446 |
| 4,551,195 | 11/1985 | Iizuka et al. | 423/290 |
| 4,632,817 | 12/1986 | Yazu et al. | 423/446 |
| 4,647,546 | 3/1987 | Hall, Jr. et al. | 501/96 |
| 4,650,776 | 3/1987 | Cerceau et al. | 501/96 |
| 4,699,687 | 10/1987 | Yazu et al. | 423/290 |
| 4,883,648 | 11/1989 | Davies et al. | 423/290 |

OTHER PUBLICATIONS

Program and Abstracts, The 28th High Pressure Conference of Japan Nov. 4-6, 1987, Kobe, Japan pp. 184-185.

Primary Examiner—Olik Chaudhuri
Assistant Examiner—M. Wilczewski
Attorney, Agent, or Firm—W. G. Fasse; D. H. Kane, Jr.

[57] ABSTRACT

In a method of manufacturing a cubic boron nitride p-n junction body, cBN seed crystals (1) of a first conductivity type are made coexist with original BN (3) and a solvent (2) containing a doping material of a second conductivity type, to grow cBN of the second conductivity type from the seed crystals (1). The solvent (2) contains 0.1 to 5 percent by weight of the doping material. The seed crystals (1) are disposed one by one in a plurality of blocks of the solvent (2), which blocks are separated from each other, to be in contact with nothing but the solvent (2). Due to such disposal, no spontaneous nucleation is caused in portions other than the seed crystals (1). A large-grained cBN p-n junction body is obtained as the result.

11 Claims, 1 Drawing Sheet

FIG.1
FIG.3
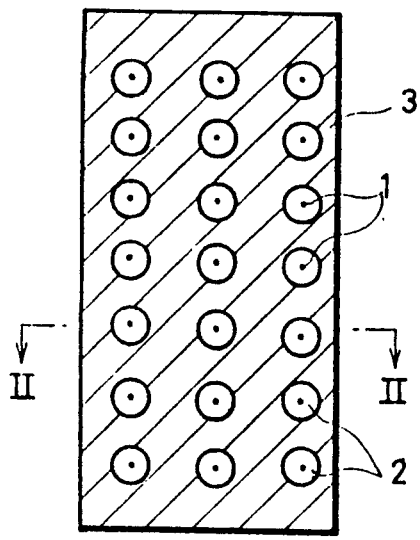
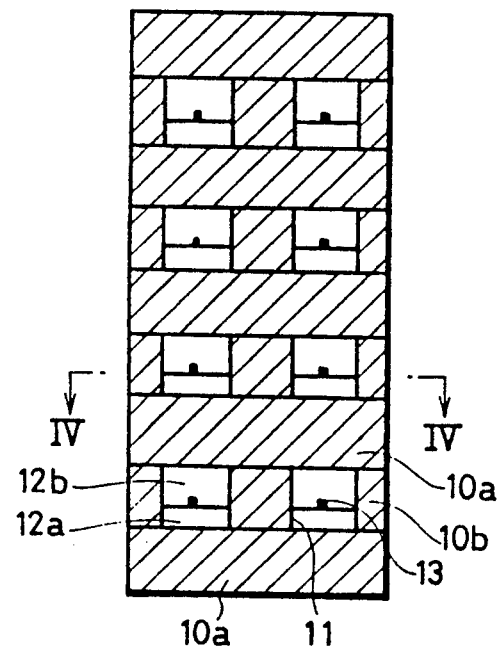
FIG.2
FIG.4
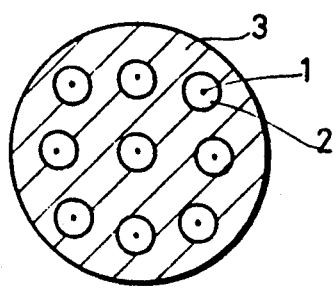
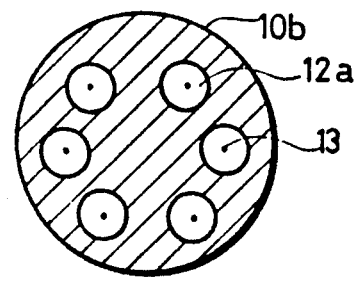

METHOD OF MANUFACTURING CUBIC BORON NITRIDE P-N JUNCTION BODY

BACKGROUND OF THE INVENTION

1. Field of the Invention

The present invention relates to a method of manufacturing a p-n junction body of cubic boron nitride (hereinafter referred to as cBN), which is effectively applied to a diode, for example.

2. Description of the Background Art cBN, which is synthesized under superhigh pressure, has a wide band gap of 6.6 eV, and is stable under a temperature up to 900° C. in the atmospheric air. Further, a p-type of n-type semiconductor material can be obtained by doping cBN with an appropriate substance. Therefore, a cBN p-n junction body forming a semiconductor device prepared by joining p-type cBN with n-type cBN is expected to stably operate under a high temperature.

U.S. Pat. No. 3,078,232 (corresponding to the Japanese Patent Publication Gazette No. 7309/1963) discloses a p-type cBN doped by Be. U.S. Pat. No. 3,141,802 (corresponding to the Japanese Patent Publication Gazette No. 24856/1963) discloses an n-type cBN doped by Si and/or Ge wherein a p-n junction cBN grain is formed. U.S. Pat. No. 3,216,942 (corresponding to the Japanese Patent Publication Gazette No. 24857/1963) discloses an n-type cBN S and/or Se and a p-n junction cBN grain is formed. A conventional method of manufacturing a cBN p-n junction body is carried out as follows:

(1) Be is added to a mixture of boron nitride (hereinafter referred to as BN) source and a solvent material. Then the mixture is exposed to superhigh pressure and temperature conditions enabling formation of cBN, thereby to synthesize cBN having a p-type semiconductor property, the crystal lattice of which is partially replaced by Be.

(2) At least one of Si, Ge, S and Se is added to a mixture of a solvent material and BN. A p-type cBN is obtained in the item (1) is so disposed and exposed to superhigh pressure and temperature as to grow cBN having an n-type semiconductor property, the crystal lattice of which is partially replaced by Si, for example, on the p-type cBN. Thus, a cBN p-n junction body is obtained.

Another method of manufacturing a larger cBN junction body is proposed on pages 184-185 of "Program and Abstracts" of The 28th High Pressure Conference of Japan held at Kobe on Nov. 4-6, 1987. In this method, the so-called temperature gradient method is employed to grow a larger cBN crystal on a seed crystal by providing the seed crystal at the interface between BN source and a solvent material with a temperature relatively higher than that of the seed crystal part. In this case, seed crystals are prepared from p-type cBN and Si is added to the solvent, thereby to manufacture a cBN p-n junction body. The cBN p-n junction body obtained in the just mentioned method is larger in size and higher in quality than that obtained in the aforementioned method, since spontaneous nucleation and the growth rate of cBN can be controlled by adjusting the temperature gradient.

In the aforementioned method disclosed in U.S. Pat. Nos. 3,141,802 and 3,216,942, a large amount of cBN p-n junction bodies can be obtained at a low cost. However, each cBN p-n junction body thus obtained has extremely small size of about 300 μm, to cause difficulty in handling in later steps. The size of the junction body is thus limited to about 300 μm, since formation/growth of cBN is unavoidably caused by spontaneous nucleation from portions other than the seed crystals, thereby restricting the spaces allowing growth of cBN from the seed crystals.

On the other hand, a cBN p-n junction body having a size of 2 or 3 millimeters can be obtained in the method employing the temperature gradient method. However, this method requires an extremely long time of tens of hours, whereby the cost is inevitably increased.

SUMMARY OF THE INVENTION

An object of the present invention is to solve the aforementioned problems and provide a method of manufacturing a large amount of large-grained cBN p-n junction bodies at a low cost.

According to the method of the invention for manufacturing a cBN p-n junction body, cBN seed crystals having a certain conductivity type semiconductor property are made to coexist with a BN source and with a solvent material containing a doping material causing a reverse conductivity type and capable of dissolving BN, to grow cBN having a reverse conductivity type semiconductor property, on the seed crystals under a thermodynamically stable condition of cBN at a temperature exceeding the melting point of the solvent material. According to the present invention, the solvent material contains 0.1 to 5 percent by weight of the doping material. The seed crystals are disposed one by one in a plurality of blocks of the solvent, which blocks are separated from each other, to be in contact with nothing but the solvent material.

Thus, no spontaneous nucleation is caused in portions other than the seed crystals. As a result, a large-grained cBN p-n junction body can be obtained. According to the present invention, further, the cBN p-n junction body can be manufactured in an extremely short time as compared with the conventional method employing the temperature gradient method.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal sectional view showing an exemplary structure of the present invention;

FIG. 2 is a sectional view taken along the line II—II in FIG. 1.

FIG. 3 is a longitudinal sectional view showing a specific structure of the present invention; and FIG. 4 is a sectional view taken along the line IV—IV in FIG. 3.

DESCRIPTION OF THE PREFERRED EMBODIMENTS

The inventors have studied the cause for spontaneous nucleation and have come to the conclusion that solvent parts unnecessary for growth of cBN on the seed crystals cause spontaneous nucleation in the conventional method. In order to prevent such spontaneous nucleation, therefore, the solvent parts unnecessary for growth on the seed crystals must be removed. According to the present invention, seed crystals are disposed one by one in a plurality of blocks of the solvent, which blocks are separated from each other, to be in contact with nothing but the solvent material.

FIGS. 1 and 2 show an exemplary structure of the present invention, which is based on the aforementioned conclusion. Referring to FIGS. 1 and 2, each seed crystal 1 of cBN having a certain conductivity type semiconductor property, is enclosed by a block 2 of a solvent, which contains a doping material causing a reverse conductivity type and is capable of dissolving BN source. A plurality of such solvent blocks 2 are distributed or disposed in a BN source member 3. The solvent contains 0.1 to 5 percent by weight of the doping material, which causes the conductivity type opposite to that of the seed crystals 1. If the seed crystals 1 have a p-type semiconductor property, the doping material is prepared from at least one element selected from a group of Si, Ge, S and Se, in order to grow n-type cBN. If the seed crystals 1 are of the n-type, the doping material is prepared from Be, for example, in order to grow p-type cBN.

It may be considered that spontaneous nucleation can be prevented by separating the solvent blocks from each other as hereinabove described, for the following reasons: First, there are no spaces allowing spontaneous nucleation since unnecessary solvent parts are removed, as hereinabove described. Second, the BN source flows uniformly from original portions to the seed crystals, whereby no local increase of BN concentration is caused in other portions except near the seed crystals.

The BN source member employed in the present invention, such as that of hexagonal BN (hereinafter referred to as hBN) or amorphous BN, is not particularly restricted to the crystal structure. However, a hot-pressed hBN sintered body is preferable since the same is easy to handle. The solvent material is preferably prepared from boronitride of an alkaline metal or an alkaline earth metal such as $Li_3BN_2$ or $Ca_3B_2N_4$, due to its high solvent ability. When the diameter of solvent material is 1 to 2 mm, a more preferable result is obtained. The p-type or n-type cBN seed crystals employed in the present invention can be easily synthesized by exposing a mixture of a solvent material containing doping material and BN source, to a superhigh pressure or temperature. The detail of such a method is disclosed in U.S. Pat. Nos. 3,078,232, 3,141,802 and 3,216,942, for example.

It is possible to manufacture a p-n-p type or n-p-n type cBN junction by further repeating the joining method for the cBN p-n junction body according to the present invention.

Examples of the present invention are now described in detail.

EXAMPLE 1

Be was added to a mixture of a BN source and a solvent material, and the mixture was exposed to a superhigh pressure or temperature sufficient for enabling the formation of cBN. The BN source was prepared from hBN powder, while the solvent material was prepared from $Li_3BN_2$ and the doping material was prepared from $Be(NO_3)_2$ powder. The ratio of hBN to the solvent material was 200 percent by weight, and the ratio of $Be(NO_3)_2$ to the solvent material was 10 percent by weight (0.68 percent by weight in Be conversion). The mixture was held under pressure of 50 kb at a temperature of 1600° C. for one hour, to obtain a large amount of p-type cBN crystals of 300 to 500 μm, to form seed crystals.

A cBN p-n junction body was prepared from the p-type cBN seed crystals obtained in the aforementioned manner, through sample chamber structure shown in FIGS. 3 and 4.

In order to obtain the sample chamber structure shown in FIGS. 3 and 4, a second BN plate 10b provided with many holes 11 is placed on a first BN plate 10a without any hole. Half part 12a of a solvent material, which contains a doping material capable of causing a certain conductivity type, is then introduced into the holes 11. Then, cBN seed crystal 13, which has an opposite conductivity type to the doping material and the remaining half part 12b of the solvent material are introduced in this order. Thereafter another first BN plate 10a is placed thereon. Thus, the sample chamber structure shown in FIGS. 3 and 4 is obtained.

A BN source was prepared by deoxidizing a hot-pressed hBN product in an $N_2$ atmosphere at 2050° C. The solvent material containing a doping material was prepared as a pressed body of 1.5 mm in diameter and 2 mm in thickness, which was formed of $Li_3BN_2$ powder containing 3 percent by weight of Si powder. The structure was held under pressure of 50 kb at a temperature of 1650° C. for three hours, whereby growth of CBN started from most of the seed crystals. About 40 percent the grown crystals reached #20 U.S. mesh size (840 μm).

The cBN p-n junction body thus obtained was subjected to a voltage of 5 V at room temperature, whereby a rectifying property was found causing a flow of current of at least five times that in the reverse direction.

EXAMPLE 2

Seed crystals were prepared from n-type cBN, which was synthesized in a similar manner to Example 1 except that the solvent material contained 3 percent by weight of S powder as a doping material. A large amount of n-type cBN crystals of 350 to 500 μm were obtained by holding under pressure of 50 kb at a temperature of 1600° C. for one hour.

The n-type cBN crystals thus obtained were employed as seed crystals, to prepare a cBN p-n junction body through the sample chamber structure shown in FIGS. 3 and 4. A BN source was prepared by deoxidizing a hot-pressed hBN product, similarly to Example 1. The solvent material containing a doping material was prepared by a pressed body of 2 mm in diameter and 3 mm in thickness, which was formed of $LiSrBN_2$ powder containing 1 percent by weight of Be powder. The structure was held under pressure of 52 kb at a temperature of 1650° C. for six hours, whereby growth started from most of the seed crystals. About 30 percent of the grown crystals reached #16 U.S. mesh size (1190 μm).

The cBN p-n junction body thus obtained was subjected to a voltage of 5 V at room temperature, whereby a rectifying property was found causing a flow of current of at least five times that in the reverse direction.

According to the present method of manufacturing a cBN p-n junction body, the seed crystals are disposed one by one in a plurality of solvent blocks, which are separated from each other, to be in contact with nothing but the solvent material. Thus, a large amount of large-grained cBN p-n junction bodies can be made at a low cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a cubic boron nitride p-n junction body, comprising the following steps:
   (a) providing a boron nitride source material,
   (b) preparing cubic boron nitride seed crystals (1) having a certain conductivity type semiconductor property,
   (c) preparing a solvent material containing 0.1 to 5.0 wt. % of a doping material for causing a conductivity type opposite to that of said seed crystals and being capable of dissolving boron nitride,
   (d) enclosing each of said seed crystals individually and uniformly on all sides in a body of said solvent material,
   (e) enclosing on all sides each of said bodies of solvent material having a seed crystal enclosed therein, in said boron nitride source material
   (f) growing cubic boron nitride having a conductivity type semiconductor property opposite to that of said seed crystals, on said seed crystals under thermodynamically stable conditions for cubic boron nitride at a temperature exceeding the melting point of said solvent material, whereby a spontaneous nucleation outside said seed crystals is avoided to cause a uniform rapid growth all around each seed crystal.

2. The method of manufacturing a cubic boron nitride p-n junction body in accordance with claim 1, wherein said seed crystals have a p-type semiconductor property, and
said doping material is prepared from at least one or two substances selected from a group consisting of Si, Ge, S and Se.

3. The method of manufacturing a cubic boron nitride p-n junction body in accordance with claim 1, wherein said seed crystals have an n-type semiconductor property, and
said doping material is prepared from Be.

4. The method of manufacturing a cubic boron nitride p-n junction body in accordance with claim 1, wherein said boron nitride source is prepared from a hexagonal boron nitride sintered body.

5. The method of manufacturing a cubic boron nitride p-n junction body in accordance with claim 1, wherein said solvent material is boronitride of an alkaline metal.

6. The method of manufacturing a cubic boron nitride p-n junction body in accordance with claim 5, wherein said solvent material is $Li_3NB_2$.

7. The method of manufacturing a cubic boron nitride p-n junction body in accordance with claim 1, wherein said body of said solvent material has a diameter within a range of 1 to 2 mm.

8. The method of manufacturing a cubic boron nitride p-n junction body in accordance with claim 1, wherein said solvent material is boronitride of an alkaline earth metal.

9. The method of manufacturing a cubic boron nitride p-n junction body in accordance with claim 5, wherein said solvent material is $Ca_3B_2N_4$.

10. The method of manufacturing a cubic boron nitride p-n junction body in accordance with claim 1, wherein said steps (d) and (e) are performed as follows: providing holes in a body of said boron nitride source material, partially filling said holes with said solvent material, inserting one of said seed crystals in each of said holes, further filling said holes with said solvent material to enclose each seed crystal individually on all sides with solvent material, and covering said filled holes with said source material.

11. The method of manufacturing a cubic boron nitride p-n junction body in accordance with claim 10, wherein said holes are formed as through-holes in a first plate of said source material, placing said first plate on a second plate of source material, performing said partially filling step, said inserting step and said further filling step, and then placing a third plate of source material on said first plate of source material, whereby the first plate of source material with its filled holes is sandwiched between said second and third plates of source material.

* * * * *